United States Patent
Bennett et al.

(10) Patent No.: US 11,627,199 B2
(45) Date of Patent: Apr. 11, 2023

(54) SYSTEM AND METHODS FOR CREATING A GEOSPATIAL NETWORK MODEL IN A CLIENT ENVIRONMENT

(71) Applicant: SCHNEIDER ELECTRIC USA INC., Andover, MA (US)

(72) Inventors: John Bennett, Garrett Park, MD (US); Kevin Abram Heater, Fort Collins, CO (US); Michael Louis Braun, Fort Collins, CO (US)

(73) Assignee: SCHNEIDER ELECTRIC USA, INC., Palatine, IL (US)

( * ) Notice: Subject to any disclaimer, the term of this patent is extended or adjusted under 35 U.S.C. 154(b) by 133 days.

(21) Appl. No.: 15/398,611

(22) Filed: Jan. 4, 2017

(65) Prior Publication Data
US 2017/0195188 A1    Jul. 6, 2017

Related U.S. Application Data

(60) Provisional application No. 62/275,076, filed on Jan. 5, 2016.

(51) Int. Cl.
*H04L 67/568*    (2022.01)
*H04L 41/22*    (2022.01)
(Continued)

(52) U.S. Cl.
CPC ............ *H04L 67/568* (2022.05); *G06F 30/18* (2020.01); *H04L 41/12* (2013.01); *H04L 41/22* (2013.01)

(58) Field of Classification Search
CPC . H04L 41/145; H04L 43/045; H04L 67/2842; G06F 17/509
(Continued)

(56) References Cited

U.S. PATENT DOCUMENTS 6,643,669 B1    11/2003    Novak et al.
7,054,799 B1    5/2006    Hartell et al.
(Continued)

FOREIGN PATENT DOCUMENTS

CN    101944204 A    1/2011
CN    102819562 A    12/2012
(Continued)

OTHER PUBLICATIONS

Collins-Sussman et al., "Version Control with Subversion, for Subversion 1.7", 2011 (Year: 2011).
(Continued)

*Primary Examiner* — Kevin S Mai
(74) *Attorney, Agent, or Firm* — Lando & Anastasi, LLP

(57) ABSTRACT

System and methods for creating a geospatial network model in a client environment are disclosed. The system residing on a client device receives Geographic Information System (GIS) data for a distribution network, which includes spatial information and non-spatial information (e.g., attributes) relating to features in the distribution network, from a remote GIS database. The system uses the spatial information in the GIS data to construct an undirected graph that is represented by a set of adjacency relationships between the features and utilizes the non-spatial information to traverse the undirected graph in order to construct a directed graph that is represented as a set of directed adjacency relationships between the features. The system stores the data structure corresponding to the directed graph in the form of an array or hashtable in the client device's cache memory for use in performing network analyses such as tracing analysis without accessing the GIS database.

19 Claims, 10 Drawing Sheets

(51) Int. Cl.
*H04L 41/12* (2022.01)
*G06F 30/18* (2020.01)

(58) Field of Classification Search
USPC .......................................................... 709/201
See application file for complete search history.

(56) References Cited

U.S. PATENT DOCUMENTS

| | | | |
|---|---|---|---|
| 7,647,136 | B2 | 1/2010 | McDowell |
| 2003/0033117 | A1 | 2/2003 | Sage |
| 2004/0236620 | A1* | 11/2004 | Chauhan ................. G06Q 10/06 705/7.14 |
| 2006/0135119 | A1* | 6/2006 | Kumar ................. H04M 11/002 455/405 |
| 2007/0168923 | A1 | 7/2007 | Connor et al. |
| 2008/0077368 | A1 | 3/2008 | Nasle |
| 2008/0091742 | A1 | 4/2008 | Marshall |
| 2008/0300834 | A1 | 12/2008 | Wiemer et al. |
| 2010/0191774 | A1 | 7/2010 | Mason, Jr. et al. |
| 2011/0205229 | A1 | 8/2011 | Jagadev et al. |
| 2011/0209081 | A1 | 8/2011 | Chen et al. |
| 2012/0022713 | A1 | 1/2012 | Deaver, Sr. et al. |
| 2012/0066578 | A1 | 3/2012 | Robin et al. |
| 2012/0127169 | A1* | 5/2012 | Barcay ................... G06T 15/20 345/419 |
| 2013/0179140 | A1 | 7/2013 | Sharma |
| 2013/0211797 | A1* | 8/2013 | Scolnicov .......... G06Q 10/0639 703/2 |
| 2014/0379850 | A1 | 12/2014 | Peterson |
| 2015/0012148 | A1 | 1/2015 | Bhageria, Jr. et al. |
| 2015/0180538 | A1* | 6/2015 | Smith ...................... H04Q 9/00 375/257 |
| 2017/0193029 | A1 | 7/2017 | Bennett et al. |
| 2017/0195187 | A1 | 7/2017 | Bennett et al. |
| 2017/0206292 | A1 | 7/2017 | Bennett et al. |

FOREIGN PATENT DOCUMENTS

| | | |
|---|---|---|
| CN | 104200394 A | 12/2014 |
| WO | 2013101510 A1 | 7/2013 |

OTHER PUBLICATIONS

Ash, Jeff, et al. "Optimizing complex networks for resilience against cascading failure," Physica a: statistical mechanics and its applications 380 (2007): 673-683, (Year: 2007).

Dharchoudhury, Abhijit et al. "Design and analysis of power distribution networks in PowerPC™ microprocessors," Proceedings 1998 Design and Automation Conference, 35th DAC, (Cat. No. 98CH36175), IEEE, 1998, (Year: 1998).

Hijazi et al., "IFC to CityGML transformation framework for geo-analysis: a water utility network case," 4th International Workshop on 3D Geo-Information, Nov. 4-5, 2009, Ghent, Belgium, 2009. (Year: 2009).

Lee, Jiyeong, "3D data model for representing topological relations of urban features," Proceedings of the 21st annual ESRI international user conference, San Diego, CA, USA, 2001. (Year: 2001).

Lee, Jiyeong, "A spatial access-oriented implementation of a 3-D GIS topological data model for urban entities," GeoInformatica 8.3 (2004): 237-264. (Year: 2004).

Sharma, Mithun J. et al. "Analytic hierarchy process to assess and optimize distribution network," Applied Mathematics and Computation 202.1 (2008): 256-265, (Year: 2008).

Sherali, Hanif D. et al. "A global optimization approach to a water distribution network design problem," Journal of Global Optimization 11.2 (1997): 107-132, (Year: 1997).

Shimizu, Yoshiaki, and Hiroshi Kawamoto, "An implementation of parallel computing for hierarchical logistic network design optimization using PSO," Computer Aided Chemical Engineering, vol. 25, Elsevier, 2008. 605-610.

* cited by examiner

PrimaryConductor Feature Class

| ID | Shape | OperatingVoltage | PhaseDesignation |
|---|---|---|---|
| 100 | [(3,8),(7,8)] | 12400 | ABC |
| 101 | [(7,8),(11,8)] | 12400 | ABC |
| 102 | [(11,8),(15,8)] | 12400 | ABC |
| 103 | [(11,8),(11,4)] | 12400 | B |

SecondaryConductor Feature Class

| ID | Shape | OperatingVoltage |
|---|---|---|
| 200 | [(15,8),(17,10)] | 240/120 |
| 201 | [(15,8),(18,8)] | 240/120 |
| 202 | [(15,8),(17,6)] | 240/120 |
| 300 | [(11,4),(9,2)] | 240/120 |
| 301 | [(11,4),(11,1)] | 240/120 |
| 302 | [(11,4),(13,2)] | 240/120 |

Switch Feature Class

| ID | Shape | ClosedPhases |
|---|---|---|
| 10 | (7,8) | ABC |

CircuitSource Feature Class

| ID | Shape | CircuitName |
|---|---|---|
| 1 | (3,8) | Trafalgar-01 |

Transformer Feature Class

| ID | Shape | PhaseDesignation |
|---|---|---|
| 50 | (15,8) | ABC |
| 51 | (11,4) | B |

ServicePoint Feature Class

| ID | Shape |
|---|---|
| 40 | (9,2) |
| 41 | (11,1) |
| 42 | (13,2) |
| 60 | (17,10) |
| 61 | (18,8) |
| 62 | (17,6) |

*FIG. 2*

| ID | Adjacent IDs |
|---|---|
| 1 | 100 |
| 10 | 100, 101 |
| 20 | 101, 102, 103 |
| 40 | 400 |
| 41 | 301 |
| 42 | 302 |
| 50 | 102, 200, 201, 202 |
| 51 | 103, 300, 301, 302 |
| 60 | 200 |
| 61 | 201 |
| 62 | 202 |
| 100 | 1, 10 |
| 101 | 10, 20 |
| 102 | 20, 50 |
| 103 | 20, 51 |
| 200 | 50, 60 |
| 201 | 50, 61 |
| 202 | 50, 62 |
| 300 | 51, 40 |
| 301 | 51, 41 |
| 302 | 51, 42 |

| ID | Adjacent IDs | Source ID | Phases |
|---|---|---|---|
| 1 | 100 | 1 | ABC |
| 100 | 10 | 1 | ABC |
| 10 | 101 | 1 | ABC |
| 101 | 20 | 1 | ABC |
| 20 | 102 | 1 | ABC |
|  | 103 | 1 | B |
| 102 | 50 | 1 | ABC |
| 50 | 200 | 1 | ABC |
|  | 201 | 1 | ABC |
|  | 202 | 1 | ABC |
| 200 | 60 | 1 | ABC |
| 201 | 61 | 1 | ABC |
| 202 | 62 | 1 | ABC |
| 103 | 51 | 1 | B |
| 51 | 300 | 1 | B |
|  | 301 | 1 | B |
|  | 302 | 1 | B |
| 300 | 40 | 1 | B |
| 301 | 41 | 1 | B |
| 302 | 42 | 1 | B |

```
enum Phases { None, A, B, C, AB, BC, AC, ABC }
class ElectricDirectedEdge
{
        int FromVertexIndex;
        int ToVertexIndex;
        int SourceIndex;
        Phases Phases;
}
class ElectricNetwork<TVertex>
{
        // The electric features in the network, represented by a
        // common base class or interface (TVertex).
        TVertex [ ] NetworkObjects;

// Array of directed adjacency lists.
        List<ElectricDirectedEdge> [ ]  OutboundEdges;
        List<ElectricDirectedEdge> [ ]  InboundEdges;

// Mapping of external object IDs (the TVertex type) onto array
        // indexes.
        Dictionary<TVertex, int> MapNetworkObjectToArrayIndex;
}
```

*FIG. 7*

SYSTEM AND METHODS FOR CREATING A GEOSPATIAL NETWORK MODEL IN A CLIENT ENVIRONMENT

CROSS-REFERENCE TO RELATED APPLICATION(S)

The present application claims priority to and benefit from U.S. Provisional Patent Application Ser. No. 62/275,076 titled "System and Methods for Creating a Geospatial Network Model in a Client Environment" filed on Jan. 5, 2016 which is expressly incorporated by reference herein.

BACKGROUND

Utility companies provide services such as electricity, gas, water, telecommunication, cable television, etc., to customers. All of these services require a distribution network for the area that is being serviced. As used herein, a distribution network comprises of pipelines, cables, and/or other equipment to facilitate distribution of a utility to customers. For example, an electrical distribution network comprising of cables/overhead lines and sub-stations facilitates distribution of electricity from a transmission/sub-transmission network to customers. Utilities such as electric distribution utilities commonly store data representing distribution facilities (e.g., poles, conductors, transformers, switching and protective equipment, etc.) in a facilities database, typically a relational database that includes geospatial attributes (i.e., a Geographic Information System or GIS). Software applications (e.g., network design applications) can then be used for designing, editing analyzing, and/or visualizing distribution networks that are represented in a GIS database (e.g., a geodatabase or GDB). One of the analysis functions provided by the software applications is "electric tracing." The electric tracing function identifies and displays on a map all of the features (i.e., objects with a geometric shape) that are electrically "upstream" or "downstream" of a given feature selected by a user as the starting point of the trace.

The implementation of the electric tracing function is based on a model of the distribution network. Existing models of the distribution network are typically based on relational database management systems (RDMS). One example of such a model is the "Geometric Network" model. The Geometric Network model comprises of a set of connected edges (lines) and junctions or vertices (points) and connectivity rules that are used to represent and model the behavior of the network in the real world. The Geometric Network model is created server-side and stored in a geodatabase.

Implementation of network analysis functions including the tracing function based on the existing network models has several problems. Taking the example of the Geometric Network model which is stored in the GIS database, a proprietary API is required to query the Geometric Network for connectivity relationships between objects and to obtain the geographic shape for objects. This API, however, is platform dependent, i.e., it is only available where there is a full installation of a corresponding software product (ArcGIS Desktop) which is available for Windows and Linux based operating systems. The software product cannot be installed on mobile operating systems such Android, iOS and Windows Mobile. While web-based access to GIS data through the ArcGIS Server product is available, the web API does not include any functions for direct access to the network topology (i.e., relationships between objects) contained in a Geometric Network. Without the access to the network topology, any usable implementation of electric tracing functions is not possible.

Another problem with existing network models is high latency. Typically, once a user makes a selection on a map in an application executing on the user device, the user has to wait for the application to make a query to the geodatabase and receive a response back from the geodatabase before the results can be rendered on a display of the user device. If the user makes another selection on the map, a new query is sent to the geodatabase. This behavior can cause the application to be slow or completely unresponsive, and thereby negatively impact user experience with the application.

In addition to the above problems, there is considerable complexity in implementing the tracing function based on the existing network models. For example, the presence of loops and multiple circuit sources may be compounded by cases where the electrical phases A, B, and C are differentially present (for conductors) and/or differentially blocked (by switching equipment) in various parts of a distribution circuit. The existing network models offer very little support for modeling these situations and as such, tracing implementations based on the existing network models are typically inefficient and susceptible to bugs.

The need exists for a model for a utility distribution network that overcomes the above problems, as well as one that provides additional benefits. Overall, the examples herein of some existing or related models and/or systems and their associated limitations are intended to be illustrative and not exclusive. Other limitations of existing models and/or systems will become apparent to those of skill in the art upon reading the following Detailed Description.

SUMMARY

Embodiments of the present disclosure include a system and method for constructing a model for a distribution network. In accordance with some embodiments, the system receives Geographic Information System (GIS) feature data for a distribution network from a GIS database, utilizes the GIS feature data to create a set of adjacency relationships between features in the distribution network and performs a traversal of the distribution network using the set of adjacency relationships and attributes of the features in each step of the traversal to generate a data structure representing a model for the distribution network. The system then stores data structure representing the model for the distribution network in a local storage.

In accordance with some embodiments, a system receives Geographic Information System (GIS) data for a utility distribution network from a GIS database, wherein the GIS data includes objects and spatial information associated with the objects. The system determines adjacency relationships between the objects using the spatial information to generate a first adjacency list, determines upstream or downstream direction and at least one associated attribute of each adjacency between the objects in the first adjacency list to generate a second adjacency list and stores the second adjacency list in a form optimized for lookup speed on a local storage to facilitate at least one of editing, analysis or visualization of a circuit in the utility distribution network. In some aspects, the form optimized for lookup speed may be an array, a hash table, or the like.

In accordance with some embodiments, a system receives Geographic Information System (GIS) data for a distribution network from a GIS database, the GIS data including spatial information relating to objects in the distribution network, constructs an undirected graph utilizing the spatial information in the GIS data, wherein the undirected graph is represented by a data structure corresponding to a set of adjacency relationships between the objects, constructs a directed graph by traversing the undirected graph starting from each source vertex and tracking attributes of the objects in each step of the traversal, wherein the directed graph is represented by a data structure corresponding to a set of directed adjacency relationships between the objects and caches the data structure corresponding to the directed graph in a cache memory.

In accordance with some embodiments, a system detects a user request to perform a tracing analysis on a circuit in an electric distribution network, wherein the user request includes a selection of a feature on the circuit. In response to the user request, the system accesses network model data corresponding to the circuit in the electric distribution network that is stored locally to determine features that are upstream and downstream of the selected feature along with at least one of source and phase attributes corresponding to each feature, the network model data including topological relationships. The system then renders a trace of: all edges with flow direction from a vertex having the source attribute via the upstream features to the selected feature based on the topological relationships; and all edges with flow direction from the selected feature via the downstream features to the extremities of the distribution network.

In accordance with some embodiments, a system receives Geographic Information System (GIS) data corresponding to a distribution network or a portion thereof from a GIS database, the GIS data including a set of adjacency relationships between features in the area of interest or information for deriving the set of adjacency relationships, performs a traversal of the distribution network or the portion thereof using the set of adjacency relationships and attributes of the features in each step of the traversal to generate a data structure representing a model for the distribution network or the portion thereof and stores the data structure locally on the hardware device.

BRIEF DESCRIPTION OF THE DRAWINGS

FIG. 2 is a graphical diagram illustrating an example of Geographic Information System ("GIS") feature data for an electric distribution circuit.

FIG. 5 is a graphical diagram illustrating an adjacency list for an undirected graph based on the GIS feature data from FIG. 2.

FIG. 6 is a graphical diagram illustrating an adjacency list for a directed graph created from the undirected graph in FIG. 5.

FIG. 7 provides an example code representation of an electric network model.

DETAILED DESCRIPTION

Figure 1:
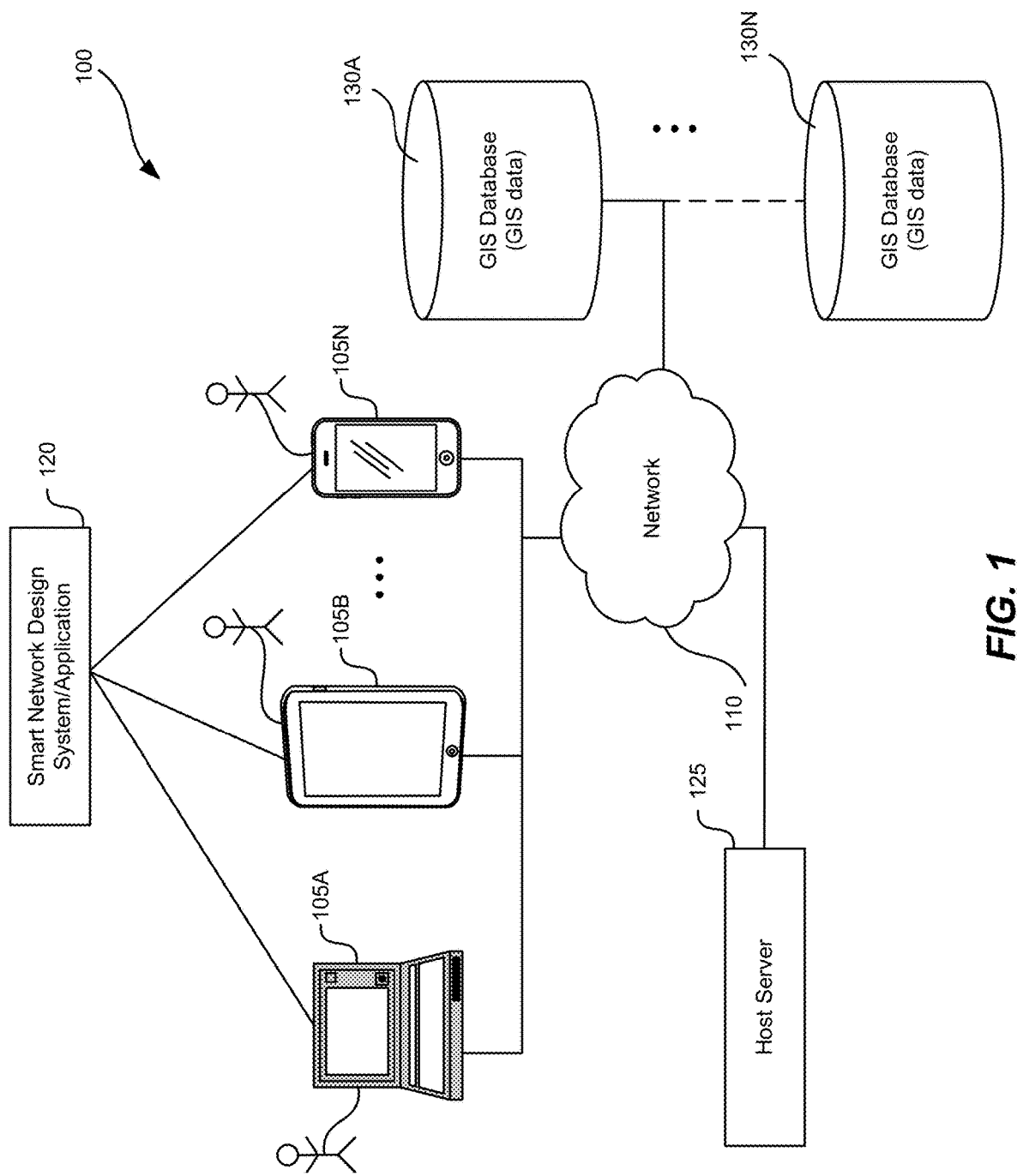
FIG. 1 is a block diagram illustrating an example environment in which a system and method for creating a geospatial network model (hereinafter "disclosed system" or "disclosed technology") can operate.

A system and methods for creating a geospatial network model (hereinafter "network model") for a distribution network in a client environment using geospatial information system (GIS) data (hereinafter "disclosed technology" or "disclosed system") are described in this disclosure. In various embodiments, the distribution network ("network") may be any utility distribution network such as an electric distribution network, a gas distribution network, a water distribution network, a telecom distribution network, or the like. In some embodiments, the disclosed technology, operating in a client environment, fetches content in the form of GIS data for an area of interest from a GIS database (e.g., a geodatabase) and transforms the GIS data into a network model. In accordance with the disclosed technology, the network model of a distribution network is a specialized data structure that is created and stored locally on a client device in order to enable real-time or near real-time analyses of the distribution network.

The network model, in accordance with some embodiments of the disclosed technology, is a directed graph comprised of vertices and directed edges. Each feature in the GIS source data can be modeled as one or more vertices in the network model. This is true for linear GIS features (e.g. electric conductors, or gas pipes) as well as for point features (e.g. transformers, switches, fuses, valves, regulators, etc.) The edges in the network model represent the directed flow of the network commodity (i.e. electric power, or gas, or water, etc.) through the facilities represented by the vertices. The edges may be endowed with attributes that provide details about the commodity flow. For example, the edges in an electric network model carry a Phases attribute to indicate which electrical phases flow through the edge from one vertex towards another, as well as a power source identifier to indicate the vertex (which may be remote) that represents the ultimate source of the power flowing through the edge (e.g. the substation circuit breaker for a distribution feeder circuit). In some embodiments, the vertices typically carry attributes to indicate the type of equipment they represent (e.g. conductor, sectionalizing device, transformer, service point, branching node, etc.) and/or other properties of interest to the modeling domain. For example, electric switches carry a property that indicates the switching state of the device (i.e. open or closed) on each phase.

As described above, in some embodiments, the disclosed technology transforms the features or database objects representing conductors, transformers, switches, fuse, and the like into a network model. In some embodiments, the transformation includes determining adjacency relationships between the GIS database objects and determining an order for the adjacency relationships, along with other attributes such as sources of power for the distribution network (e.g., feeder systems) and electrical phases. Thus, following the transformation process, each object in the network model knows not only who its neighbors are but also which of the objects are its upstream neighbors and which of the objects are its downstream neighbors, where the power that energizes the distribution network is coming from and which of the energized electrical phases are being allowed to flow through the adjacencies.

In accordance with some embodiments of the disclosed technology, the transformation of the GIS data comprises using the GIS data for a distribution network to construct an undirected graph (or undirected network) which establishes adjacency relationships between the features. The undirected graph can be represented by an adjacency list that includes object pairs that are adjacent to each other. For example, if object $V_1$ is neighbors with object $V_2$, the adjacency list would comprise the following pairs of objects: ($V_1$, $V_2$) and ($V_2$, $V_1$). In other words, the path may go from $V_1$ to $V_2$ or from $V_2$ to $V_1$. The transformation process further includes performing a series of traversals of the undirected graph starting at each circuit source vertex paying attention to the phase attribute of the features to create a directed graph. The directed graph comprises a set of directed adjacencies and is represented by an adjacency list that includes ordered object pairs with source and phase properties or attributes. In alternative embodiments, GIS can be the source for adjacency relationships, and as such the transformation process can comprise transforming the undirected graph into a directed graph as described above. In some embodiments, the disclosed technology renumbers the objects in the directed graph so that the data structure corresponding to the directed graph can be stored in the form of an array or any other suitable form optimized for lookup speed in a memory (e.g., cache memory) on the client device. The disclosed technology also generates a mapping between the original object IDs (or GIS IDs) and the array indexes to enable adjacent object look ups in constant time regardless of the size of the array. In other words, the disclosed technique for storing the directed graph ensures that the adjacency look up performance is predictable and not worse on bigger networks with more features. Alternatively, in some embodiments, adjacency look ups may be based on a hash look up of GIS IDs.

With the source and phase properties on each adjacency being available from the directed graph data structure which is stored locally in memory, the tracing operation according to the disclosed technology does not need to perform additional GIS database queries beyond the initial database queries to fetch GIS data (i.e., spatial and geometric data). By keeping the GIS database queries to a minimum, and thereafter, constructing and storing the network model locally on a client device, the disclosed technology saves on bandwidth and other network resources.

The disclosed technology further implements the tracing operation more efficiently and thereby improves the speed at which tracing operations are performed and results of the operations are displayed to a user. The disclosed technology simplifies some of the complexity behind the implementation of the tracing operation. The disclosed technology also re-uses as much of the pre-computed locally stored network model data as possible for tracing operations so that the amount of new calculations to be performed is reduced. This technique helps improve the speed of tracing operations so that a user can repeatedly select any point on a map and be able to view results of the tracing operations instantly, in real-time, without any perceivable latency. Moreover, once the GIS data has been fetched, the disclosed technology performs the initial calculations and any new calculations without the help of a server, which has the advantage of providing offline network analysis functionality.

The disclosed technology provides various other advantages. For example, the disclosed technology is platform and device agnostic. The technology codebase can be adapted for various operating systems including Windows OS, Mac OS and Linux OS, as well as mobile operating systems such as Windows Mobile, iOS, Android, and/or the like. The disclosed technology thus enables a user to be able to perform network analysis using a portable client device such as a tablet from any location (e.g., field site).

1. Example Environment

FIG. 1 is a block diagram illustrating an example environment in which the disclosed technology can operate. As illustrated, the environment 100 comprises one or more client devices 105A-N (hereinafter client device 105), a communication network 110 and one or more GIS databases 130A-N (hereinafter GIS database 130). The client device 105 can be any hardware device that is able to establish a connection with another device or server, directly or via a communication network 110. Examples of a client device 105 include, but are not limited to: a desktop computer, a thin-client device, a mobile computing device such as a notebook, a laptop computer 105A, a handheld computer, a mobile phone, a smart phone 105N, a tablet 105B, a phablet, and/or the like. The client device 105 typically includes one or more input/output devices to facilitate user interaction (e.g., to display a map, to enable a user to make a selection of an area on the map). The disclosed system can be embodied in a smart network design (SND) application 120 (hereinafter "design application 120") which is installed in the client device 105. The design application 120 can be downloaded from a server (e.g., host server 125, an application store or a repository) and installed on the client device 105. In some embodiments, the design application 120 can be a web-based application that can be accessed via a web-browser. In some embodiments, the web-based application can operate by utilizing data stored in the browser's local storage (i.e., network model data remains in the client device but the data may be periodically backed up in the host server or a cloud). Various components or modules of the disclosed system are described in detail in reference to FIG. 4.

The GIS database 130 is a database or file structure that stores objects defined in a geometric space. One example of a GIS database is a geodatabase. Typically, each utility maintains its own GIS database. For example, a gas company can have its own GIS database that stores GIS data for its gas distribution network. Similarly, an electric company can have its own GIS database that stores GIS data for its electric distribution network. The GIS database 130 typically supports query execution on stored data as well as manipulation of the stored data. Examples of data stored in the GIS database include, but are not limited to: geometry or shape data and attributes of objects, typically grouped into different feature classes. The GIS database 130 may be implemented in Microsoft SQL Server, PostgreSQL relational database management systems, Microsoft Access, Oracle, IBM DB2, IBM Informix, and/or the like.

The communication network 110, over which the client device 105 and the one or more geodatabases 130 communicate may be a telephonic network, an open network, such as the Internet, or a private network, such as an intranet and/or the extranet. The communication network 110 can be any collection of distinct networks operating wholly or partially in conjunction to provide connectivity to the client devices 105 and the GIS databases 130 and may appear as one or more communication networks to the serviced systems and devices. In some embodiments, communications can be achieved by a secure communications protocol, such as secure sockets layer (SSL), or transport layer security (TLS).

In addition, communications can be achieved via one or more wireless networks, such as, but is not limited to, one or more of a Local Area Network (LAN), Wireless Local Area Network (WLAN), a Personal area network (PAN), a Campus area network (CAN), a Metropolitan area network (MAN), a Wide area network (WAN), a Wireless wide area network (WWAN), Global System for Mobile Communications (GSM), Personal Communications Service (PCS), Digital Advanced Mobile Phone Service (D-Amps), Bluetooth, Wi-Fi, Fixed Wireless Data, 2G, 2.5G, 3G, 4G, 4G-LTE networks, enhanced data rates for GSM evolution (EDGE), General packet radio service (GPRS), enhanced GPRS, messaging protocols such as, TCP/IP, SMS, MMS, extensible messaging and presence protocol (XMPP), real time messaging protocol (RTMP), instant messaging and presence protocol (IMPP), instant messaging, USSD, IRC, or any other wireless data networks or messaging protocols.

The client devices 105 can be coupled to the communication network 110 (e.g., Internet) via a dial up connection, a digital subscriber loop (DSL, ADSL), cable modem, and/or other types of connection. Thus, the client devices 105 can communicate with remote servers (e.g., SND/host server 125, GIS database 130, mail server, instant messaging server), some of which may provide access to user interfaces of the World Wide Web via a web browser, for example.

FIG. 2 is a graphical diagram illustrating an example of Geographic Information System ("GIS") feature data for an electric distribution circuit that is transformed into a network model for the electric distribution circuit by the disclosed technology.

The GIS feature data 200 stored in a GIS database (e.g., GIS database 130) includes various feature classes (i.e., database tables) such as the CircuitSource, Transformer, ServicePoint, PrimaryConductor, SecondaryConductor and Switch feature classes. These feature classes are exemplary and some GIS databases may include additional or different set of feature classes depending on the GIS data model. By way of example, in addition to the PrimaryConductor and SecondaryConductor feature classes, the GIS data model for conductors may also include other feature classes such as UndergroundPrimaryConductor, UndergroundSecondaryConductor and BusbarConductor feature classes (not shown). Each feature class includes a collection of individual features or objects, each having an object identifier (ID) and the geometry for the features stored as a shape comprising a sect of vector coordinates (e.g., point, line, polygon), and/or attributes. In this example, the shape or geometry information is conveyed through "geographic coordinates" in a Cartesian arrangement, but other coordinate systems may be used in some other embodiments. For example, the Transformer feature class includes two objects, each having an object ID (50 and 51), a shape (points or vertices given by coordinates (15, 8) and (11, 4)) and an attribute—a phase designation ("ABC" and "B").

An electric distribution circuit typically comprises of a basic trunk or skeleton of 3-phase conductors and equipment, as well as some branches that carry only one or two electrical phases (the neutral conductor may or may not be present in any of the parts of the circuit without regard to the number of phases present). In the GIS model of electric distribution circuit components, a single linear object is used to represent up to 4 separate physical conductor segments that follow a parallel, namely one for each of the 3 electrical phases "A", "B" and "C," and a possible neutral conductor. The actual number and phase-identity of the set of conductors represented by a conductor object in GIS is indicated by a Phase Designation attribute whose value is any combination of the phase letters "A", "B" and "C". Furthermore, each switch, fuse, recloser or other sectionalizing device in the GIS representation of a circuit carries a switch state attribute that indicates whether it is normally open or closed, for each of the 3 phases independently (e.g. a switch may be closed on phase A but open on phases B and C). Thus, if a switch is open on phase A, then power cannot reach any objects downstream of that switch on phase A, even if power might still flow to that equipment on phases B and C (which it will do if the switch is closed on those phases). The names "A", "B" and "C" for the phases are not universal. Some countries use a different naming convention, (e.g. "Red", "Green" and "Brown," or "R", "G" and "B," or others) although virtually all AC electric power distribution systems in the world are 3-phase systems and the physical function and technical description of the three phases is everywhere the same. The SND application 120 allows the naming convention to be configured to agree with the local practice.

By way of another example, the PrimaryConductor feature class includes four objects, each having an object ID (100, 101, 102, 103) and a linear shape, as well as additional attributes including an operating voltage and a phase designation for the object.

Figure 3:
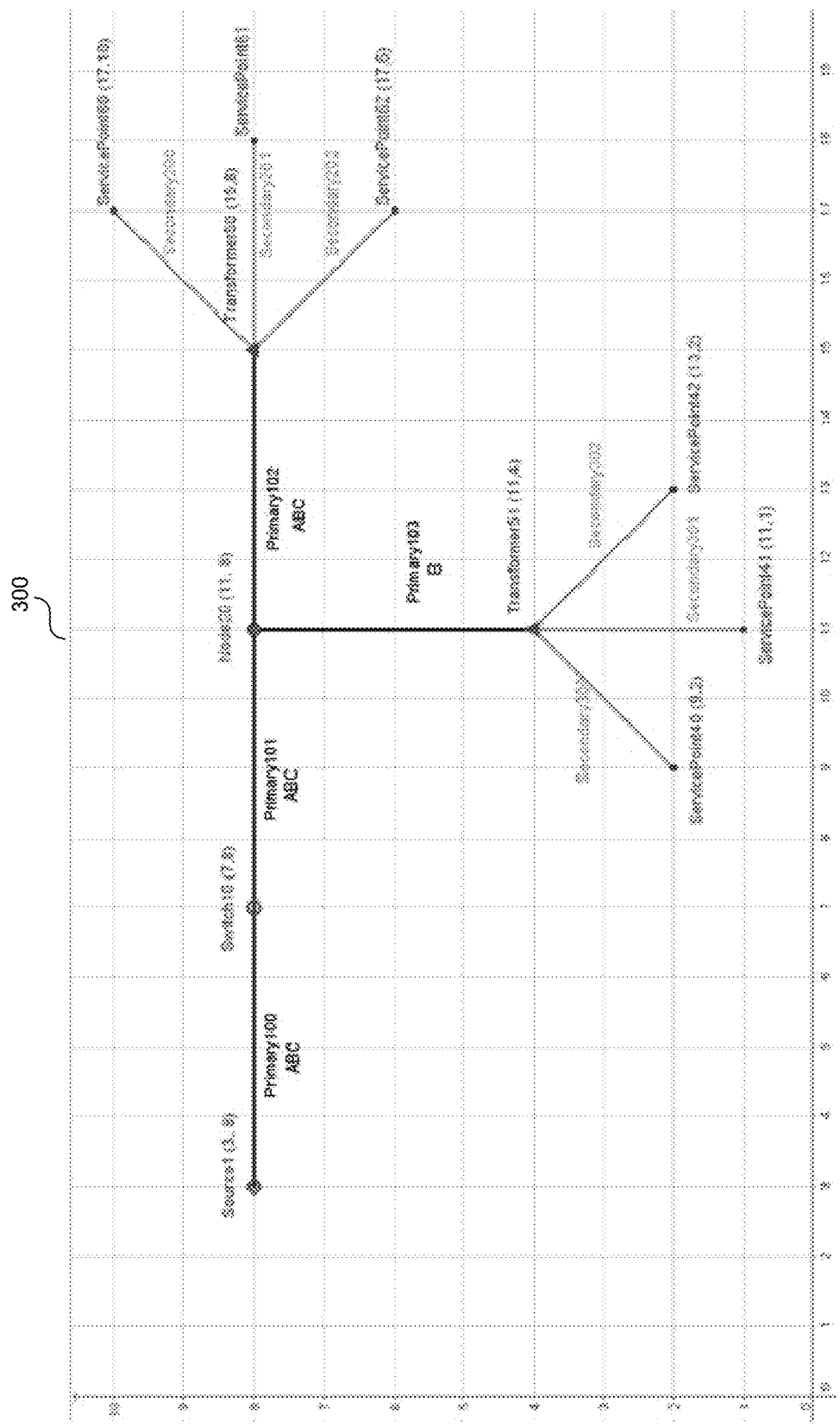
FIG. 3 is a graphical diagram illustrating a graphical representation of the GIS feature data from FIG. 2.

FIG. 3 is a graphical diagram illustrating a graphical representation of the GIS feature data from FIG. 2.

The disclosed technology, in some embodiments, uses the geometric information in the GIS feature data to construct an undirected graph (or undirected network) which is a set of adjacency relationships between the features. The adjacency relationships between the features can be clearly illustrated by plotting or tracing on a graph the geometric information in the GIS feature data. For example, the PrimaryConductor 101 coincides with the location of Switch 10 as well as Node 20 in the graph 300, resulting in the creation of two adjacency relationships—one between the PrimaryConductor 101 and the Switch 10 and another between the PrimaryConductor 101 and the Node 20. The adjacency relationship can be represented by an ordered pair of object IDs: (101, 10) and (101, 20). Since it is an undirected graph, the adjacency relationship is commutative, so the complementary ordered pairs (10, 101) and (20, 101) will also be created.

Figure 4:
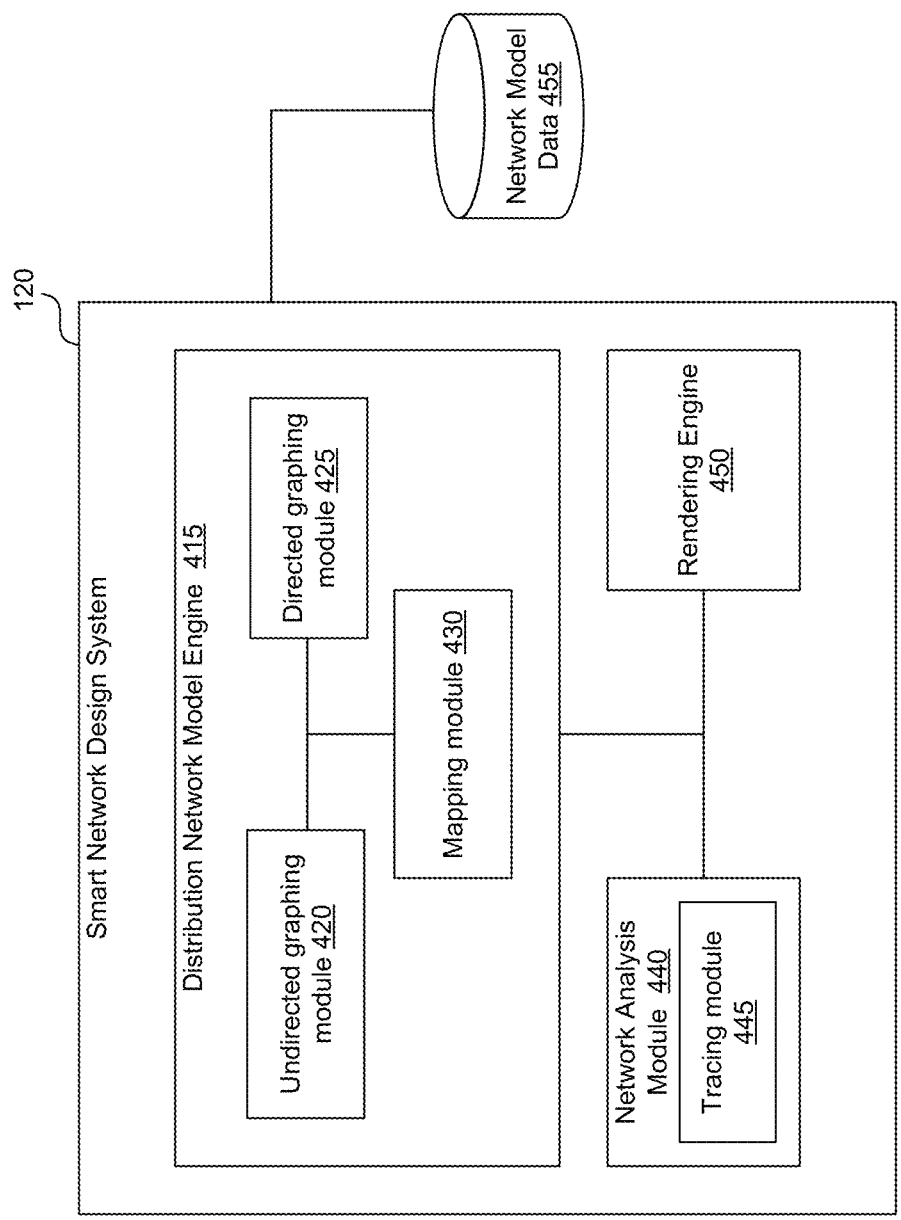
FIG. 4 is a block diagram illustrating example components of the disclosed system in some embodiments.

FIG. 4 is a block diagram illustrating example components of the disclosed system or application 120 in some embodiments.

The disclosed system 120 resides in a client device 105 which can be any of the client devices 105 described in reference to FIG. 1. In some embodiments, the disclosed system 120 includes a network modeling engine 415 having an undirected graphing module 420, a directed graphing module 425 and a mapping module 430, a network analysis module 440 having a tracing module 445, and a rendering engine 450. The client device 105 includes a cache memory 455 in which the network model data generated from network model engine 415 is stored for fast access by the network analysis module 440. In some embodiments, the disclosed system 120 may include more or less components. Each of these components of the disclosed system 120 will now be described in detail with reference to FIGS. 5 and 6.

The network modeling engine 415 generates the network model that supports various operations such as visualization, network analysis (e.g., tracing, load flow analysis, operating voltage calculations) and/or editing on a distribution network. The network modeling engine 415, via the undirected graphing module 420, the directed graphing module 425 and/or the mapping module 430, can transform GIS feature data (e.g., the GIS feature data described in reference to FIG. 2) obtained from a GIS database (e.g., GIS database 130 described in reference to FIG. 1) into a specialized data structure that can be utilized by the tracing module 445 to determine for any given vertex in the graph (e.g., corresponding to a selection made by a user on a map), the set of all vertices that are upstream and/or downstream of that vertex, with regard to the direction of flow of the network commodity (e.g., electric power, water, gas, electromagnetic signal and/or the like). The rendering engine 450 can then render all the features that are upstream of the vertex and all the features that are downstream of the vertex in distinct styles (e.g., by using different coloring schemes or highlighting) to clearly illustrate the flow path of respective electrical phases through the features starting from the source vertex.

In some embodiments, the undirected graphing module 420 utilizes the geometric information in the GIS feature data to construct an undirected graph. As used herein, an undirected graph is a set of adjacency relationships between objects. An adjacency relationship between objects is represented by a commutative pair of object IDs. Referring to FIG. 2, one of the endpoints of PrimaryConductor 101 coincides with the location of Switch 10. The undirected graphing module 420 recognizes this connection or adjacency between PrimaryConductor 101 and Switch 10 and in response creates an adjacency relationship between those objects, represented by an ordered pair of object IDs: (101, 10). Since it is an undirected graph, the adjacency relationship is commutative, so the undirected graphing module 420 also creates a complementary ordered pair (10, 101). Once the adjacency relationships between objects have been determined, the undirected graphical module 420 generates an adjacency list or data structure representing the undirected graph. An example of the adjacency list representing the undirected graph constructed from the GIS feature data 200 from FIG. 2 is depicted in FIG. 5. As illustrated, the adjacency list 500 includes a collection of object IDs and adjacent object IDs. In other words, the adjacency list 500 associates each object in the undirected graph with a set of neighboring objects. For example, object ID 1 is associated with its neighbor object ID 100, and object ID 100 is associated with its neighbors which include object ID 1, as well as object ID 10. In alternative embodiments, a GIS database (e.g., GIS database 130) can be the source of the adjacency list or data structure representing the undirected graph.

The directed graphing module 425 operates on the undirected graph, performing a series of traversals of the undirected graph, beginning at each object that is a source vertex to construct a directed graph. As used herein, a directed graph is a set of objects having adjacency relationships, where all the adjacency relationships are directed from one object to another. When traversing the undirected graph, the directed graphing module 425 pays attention to selected attributes of certain objects that are of interest to the application domain. In the domain of electric power distribution, for example, the directed graphing module 425 examines the PhaseDesignation attribute of conductor vertices in the graph and to the ClosedPhases attribute of vertices representing sectionalizing devices. The directed graphing module 425 then uses these attributes to determine, at each step in the traversal, which of the electrical phases that reach a vertex via a given adjacency can be permitted to continue on to the other adjacencies of the vertex. For example, a switch that is open on all three phases blocks all phases, and thus a traversal halts upon reaching any open switch. By way of another example, if a traversal brings phases ABC up to a switch that is closed on phases BC but open on phase A, then only phases B and C will be allowed to pass on to the conductor on the far side of the switch. In other words, each time a traversal reaches a vertex $V_2$ coming from an adjacent vertex $V_1$, the directed graphing module 425 creates, in a new graph, a directed edge $(V_1, V_2)$ that carries two additional attributes: SourceID and Phases. The SourceID attribute identifies the source vertex from which the traversal began. The SourceID attribute, in some embodiments, effectively serves as an identifier for the entire distribution circuit that is energized by that source. The Phases attribute indicates which electric phases reach all the way from that source to vertex $V_2$, arriving via vertex $V_1$.

Referring to the example distribution circuit corresponding to the GIS feature data 200 of FIG. 2, the directed graphing module 425 performs a traversal of the undirected graph to output an adjacency list for the directed graph as illustrated in FIG. 6. The adjacency list 600 for the directed graph includes a set of directed adjacencies with corresponding Source and Phases attributes. The data structure 600 readily supports a tracing operation, i.e., enumerates, for any given vertex in the graph, the set of all vertices that are downstream of that vertex, and all the vertices that are upstream of that vertex. For example, from the data structure it is apparent that vertices 50 and 51 are downstream of vertex 10.

The mapping module 430, in some embodiments, manipulates the adjacency list representing the directed graph to optimize the look up performance for network analysis (e.g., tracing or any other operations), so that the look up performance does not become progressively worse as the size and complexity of a distribution circuit increases. In some embodiments, the mapping module 430 achieves the optimization by renumbering the objects in the directed graph so that the adjacency list for the directed graph can be stored in the form of an array where the array index serves as a proxy for the object's original ID as known to the GIS. Indexing the array in this manner enables random access to the adjacencies for any given vertex in the network, so that the lookup complexity for adjacencies is $O(1)$. The mapping module 430 creates a mapping of GIS IDs to array indexes in the network model, and vice versa, so that the start object for a tracing action can be converted into the corresponding array index, and so that the trace results, which are developed as a set of array index values to represent the traced objects, can be converted into GIS IDs for those objects. In some embodiments, the adjacency list for the directed graph can be stored in the form of hashtables. In other embodiments, the mapping module 430 may be optional.

In some embodiments, the specialized data structure representing the network generated by the network model engine 415 is stored in a cache memory 455. When a user selects an object on a map to see the tracing results, the tracing module 445 accesses the network model data in the cache memory 455 to look up objects that are upstream and/or downstream of the object. Because of the caching of the network model data, there is no need to start from the GIS feature data or data representing the undirected graph and traverse the undirected graph again. Instead the module 425 will have already performed the traversal of the undirected graph once to create the directed graph and in some embodiments, the mapping module 430 will have already converted the data structure for the directed graph into an array or hashtable format and stored the array or hashtable in the cache memory 455. This means that in addition to the upstream and downstream orientations, electrical phases and information about the power source are precalculated and can be quickly recalled from the cache memory for tracing operations or to respond to attribute queries on any object in the circuit. For example, a user can select any object on a circuit, the network analysis module 440 can access the cache memory 455 to recall information such as the power source for that object and the phases that reach the object from the power source and instantly display the results on the map, without performing additional calculations or network operations (e.g., communicating with a server over a network).

In some embodiments, the structure of the output from the mapping module 430, i.e., a directed graph streamlined for electric circuit tracing in both upstream and downstream directions, can be fully represented in an object oriented programming language using two classes: one class to represent the directed edges with their attributes, and the network class itself that includes the network objects, the adjacencies between the objects (i.e., the directed edges), and the mapping of network object IDs to array index values. FIG. 7 depicts an example code representation of an electric network model expressing the directed edge class and the network class using C#programming language.

In some embodiments, the adjacency list representing the undirected graph (generated by the undirected graphing module 220 or received from the GIS database 130) can support at least some of the operations relating to visualization, network analysis (e.g., tracing, load flow analysis, operating voltage calculations), validation and/or editing on a distribution network. As such, the adjacency list can be stored locally on the client device (e.g., in a cache memory 455) in its original form, or in a form (e.g., array, hashtable) optimized for lookup speed (e.g., via the mapping module 430).

Figure 8:
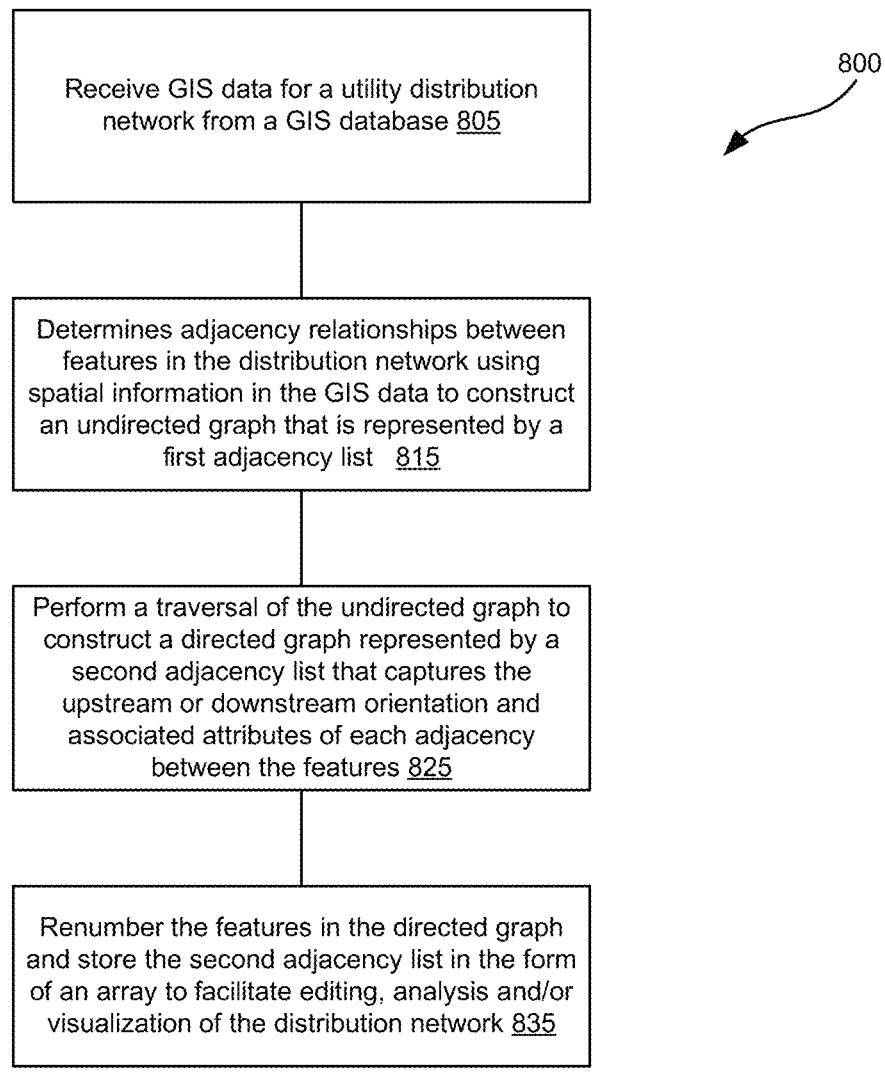
FIG. 8 is a logic flow diagram illustrating an example method of creating a geospatial network model within a client environment using raw GIS feature data from a geodatabase.

FIG. 8 is a logic flow diagram illustrating an example method of creating a network model within a client environment using GIS feature data from a GIS database. The example method can be implemented by the disclosed system/application 120 described in reference to FIG. 4 and can be used for generating network models for other utilities besides electric utility, such as water, gas, telecommunication, or the like.

In some embodiments, a user selects an area on interest on a map displayed on a client device (e.g., client device 105) for which the user wants to create a network model. In some instances, the user may draw a boundary on a map to define the area of interest (e.g., a distribution network or a portion thereof). Once the disclosed system detects the request from the user to create a network model for an area, the disclosed system queries a GIS database that is remote from the client device for network data or GIS data corresponding to the area of interest. At block 805, the disclosed system receives GIS data from the GIS database in response to its query. In some embodiments, the GIS data can include information about GIS features and associated spatial (or geometry) information. At block 815, the disclosed system determines adjacency relationships between the features using the spatial information to construct an undirected graph. The undirected graph can be represented by a first adjacency list that comprises pairs of object IDs, with each pair of object IDs representing an adjacency relationship. In some embodiments, the GIS data can include adjacency relationships between features. In such a case, the undirected graph need not be generated. At block 825, the disclosed system performs a traversal of the undirected graph to construct a directed graph that captures the upstream or downstream orientation and associated attributes of each adjacency between the features. The directed graph can be represented by a second adjacency list that comprises of a set of directed adjacencies with corresponding attributes. At block 835, the disclosed system renumbers the objects in the directed graph and stores the second adjacency list in the form of an array to facilitate editing, analysis and/or visualization of the distribution network. The disclosed system can also store mapping information that maps the original object IDs to the array indexes and vice versa. The network model created by the disclosed system thus includes the array and the mapping information. In other embodiments, the second adjacency list can be stored in the form of a hashtable optimized for lookup speed. The network model data can be stored in cache memory on the client device in some embodiments to improve the look up performance for adjacencies and associated attributes that are utilized by network analysis modules 440 such as the tracing module 445 described in reference to FIG. 4. In yet other embodiments, the second adjacency list can be stored in its original form, without optimization.

Figure 9:
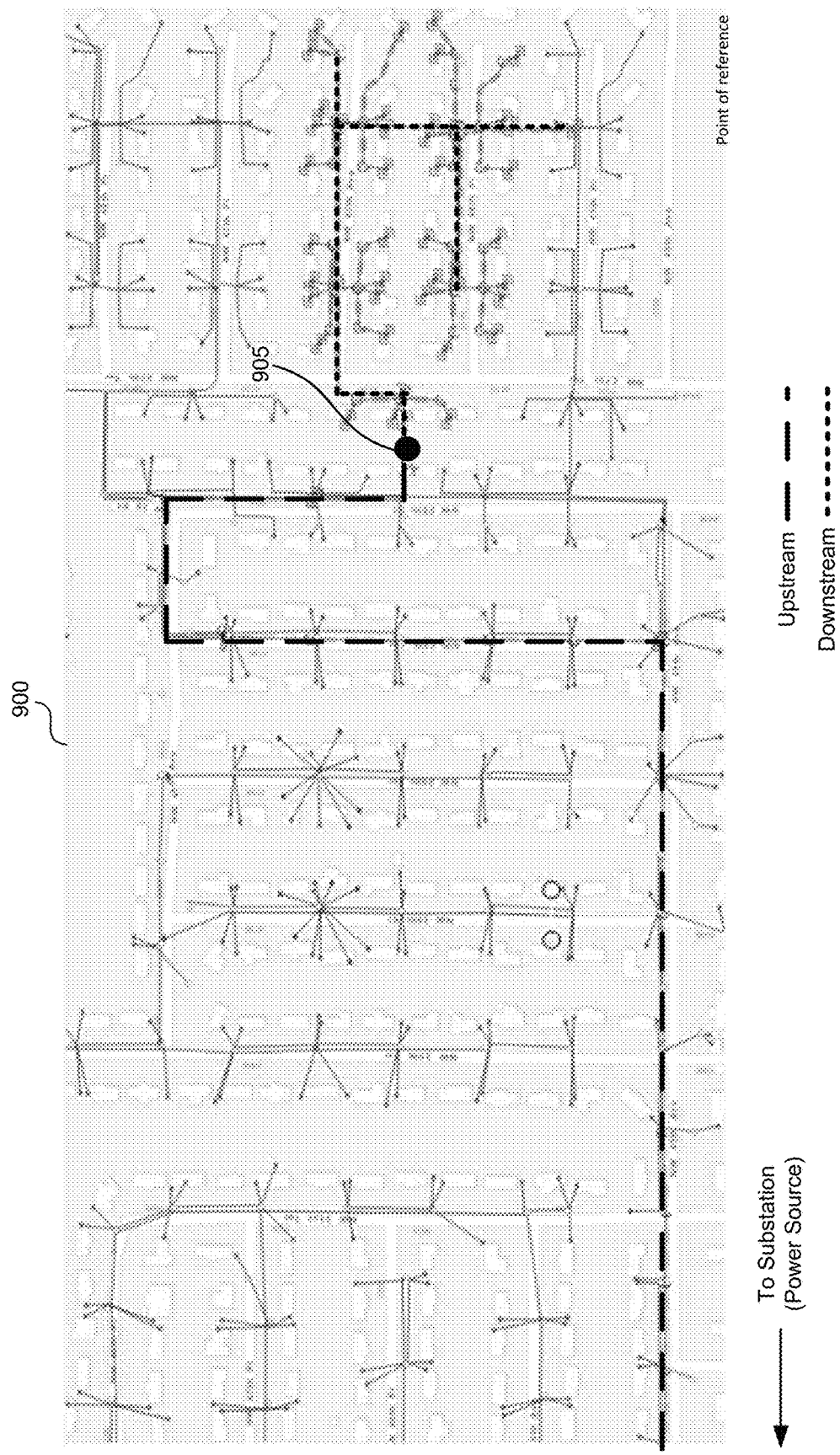
FIG. 9 is a graphical diagram illustrating a portion of an electric distribution circuit with tracing results showing objects that are upstream and downstream from a point of selection.

FIG. 9 is a graphical diagram illustrating a portion of an electric distribution circuit with tracing results showing objects that are upstream and downstream from a point of selection. As depicted, with the tracing function turned on, when a user hovers over (or clicks or taps or otherwise selects) a point (e.g., point 905) on the map 900, the tracing module 445 of the disclosed system uses the network model data stored in the cache memory to identify the upstream objects and the downstream objects relative to the location of the point 905. The rendering engine 450 then displays the path from a substation (not shown) that is the source of power in a distribution feeder circuit, highlighting the upstream objects in one color or style (e.g., light blue color) and all the downstream objects in another color or style (e.g., red color). When the user selects another point on the distribution feeder circuit, the tracing module 445 and the rendering engine 450 respond instantaneously to identify and display all the objects upstream of that point, and all the objects downstream of that point. The response is instantaneous, with no perceivable latency, because the network model data is mostly or entirely pre-calculated, and localized, which eliminates the need for sending out network queries to the GIS each time a new point on the map is selected for tracing.

Figure 10:
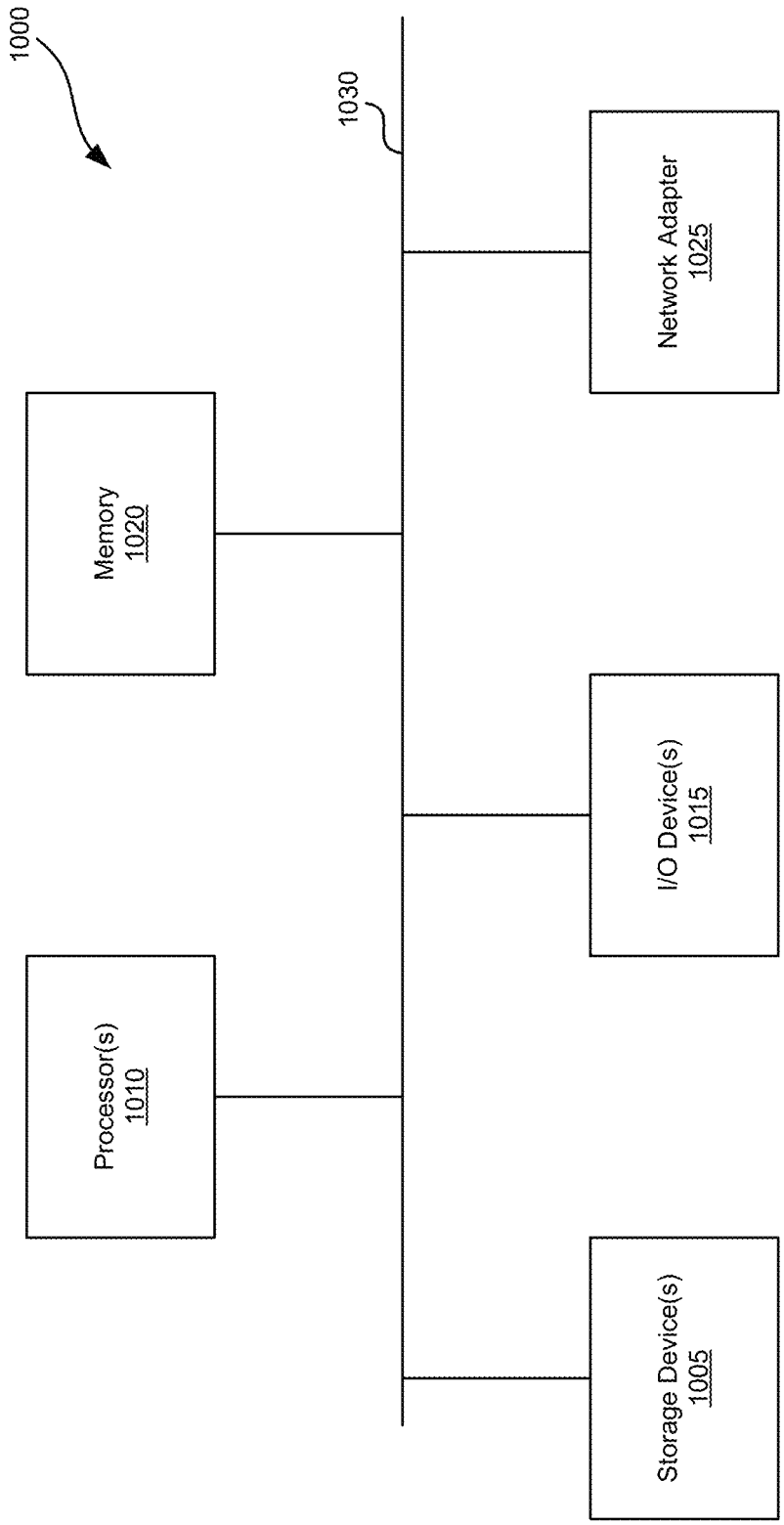
FIG. 10 is a block diagram of an exemplary apparatus that can perform various operations, and store various information generated and/or used by such operations in some embodiments of the disclosed technology.

FIG. 10 is a block diagram of an exemplary apparatus that can perform various operations, and store various information generated and/or used by such operations in some embodiments of the disclosed technology.

The apparatus can represent any computer described herein. The computer 1000 is intended to illustrate a hardware device on which any of the entities, components or methods depicted in the examples of FIGS. 1-9 (and any other components described in this specification) can be implemented, such as a server, client device 105, storage devices, databases (e.g., GIS database 130), network modeling engine 415, network analysis module 440, tracing module 445, rendering engine 450 and/or the like. The computer 1000 includes one or more processors 1010 and memory 1020 coupled to an interconnect 1030. The interconnect 1030 is shown in FIG. 10 as an abstraction that represents any one or more separate physical buses, point to point connections, or both connected by appropriate bridges, adapters, or controllers. The interconnect 1030, therefore, may include, for example, a system bus, a Peripheral Component Interconnect (PCI) bus or PCI-Express bus, a Hyper- Transport or industry standard architecture (ISA) bus, a small computer system interface (SCSI) bus, a universal serial bus (USB), IIC (I2C) bus, or an Institute of Electrical and Electronics Engineers (IEEE) standard 1394 bus, also called "Firewire".

The processor(s) 1010 is/are the central processing unit (CPU) of the computer 1000 and, thus, control the overall operation of the computer 1000. In some embodiments, the processor(s) 1010 accomplish this by executing software or firmware stored in memory 1020. The processor(s) 1010 may be, or may include, one or more programmable general-purpose or special-purpose microprocessors, digital signal processors (DSPs), programmable controllers, application specific integrated circuits (ASICs), programmable logic devices (PLDs), trusted platform modules (TPMs), or the like, or a combination of such devices.

The memory 1020 is or includes the main memory of the computer 1000. The memory 1020 represents any form of random access memory (RAM), read-only memory (ROM), flash memory, or the like, or a combination of such devices. In use, the memory 1020 may store a code. In some embodiments, the code includes a general programming module configured to recognize the general-purpose program received via the computer bus interface, and prepare the general-purpose program for execution at the processor. In another embodiment, the general programming module may be implemented using hardware circuitry such as ASICs, PLDs, or field-programmable gate arrays (FPGAs).

Also connected to the processor(s) 1010 through the interconnect 1030 are a network adapter 1025, a storage device(s) 1005 and I/O device(s) 1015. The network adapter 1025 provides the computer 1000 with the ability to communicate with remote devices, over a network and may be, for example, an Ethernet adapter or Fibre Channel adapter. The network adapter 1025 may also provide the computer 1000 with the ability to communicate with other computers within a cluster. In some embodiments, the computer 1000 may use more than one network adapter to deal with the communications within and outside of the cluster separately.

The I/O device(s) 1015 can include, for example, a keyboard, a mouse or other pointing device, disk drives, printers, a scanner, and other input and/or output devices, including a display device. The display device can include, for example, a cathode ray tube (CRT), liquid crystal display (LCD), or some other applicable known or convenient display device.

The code stored in memory 1020 can be implemented as software and/or firmware to program the processor(s) 1010 to carry out actions described above. In certain embodiments, such software or firmware may be initially provided to the computer 1000 by downloading it from a remote system through the computer 1000 (e.g., via network adapter 1025).

The technology introduced herein can be implemented by, for example, programmable circuitry (e.g., one or more microprocessors) programmed with software and/or firmware, or entirely in special-purpose hardwired (non-programmable) circuitry, or in a combination of such forms. Special-purpose hardwired circuitry may be in the form of, for example, one or more ASICs, PLDs, FPGAs, etc.

Software or firmware for use in implementing the technology introduced here may be stored on a machine-readable storage medium and may be executed by one or more general-purpose or special-purpose programmable microprocessors. A "machine-readable storage medium", as the term is used herein, includes any mechanism that can store information in a form accessible by a machine.

A machine can also be a server computer, a client computer, a personal computer (PC), a tablet PC, a laptop computer, a set-top box (STB), a personal digital assistant (PDA), a cellular telephone, an iPhone, a Blackberry, a processor, a telephone, a web appliance, a network router, switch or bridge, or any machine capable of executing a set of instructions (sequential or otherwise) that specify actions to be taken by that machine.

A machine-accessible storage medium or a storage device(s) 1005 includes, for example, recordable/non-recordable media (e.g., ROM; RAM; magnetic disk storage media; optical storage media; flash memory devices; etc.), etc., or any combination thereof. The storage medium typically may be non-transitory or include a non-transitory device. In this context, a non-transitory storage medium may include a device that is tangible, meaning that the device has a concrete physical form, although the device may change its physical state. Thus, for example, non-transitory refers to a device remaining tangible despite this change in state.

The term "logic", as used herein, can include, for example, programmable circuitry programmed with specific software and/or firmware, special-purpose hardwired circuitry, or a combination thereof.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the disclosure is not intended to be exhaustive or to limit the teachings to the precise form disclosed above. While specific embodiments of, and examples for, the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed at different times. Further any specific numbers noted herein are only examples: alternative implementations may employ differing values or ranges.

The teachings of the disclosure provided herein can be applied to other systems, not necessarily the system described above. The elements and acts of the various embodiments described above can be combined to provide further embodiments.

The disclosed technology can also be adapted to other aspects of a utility distribution system such as the transmission/sub-transmission networks or the like.

Any patents and applications and other references noted above, including any that may be listed in accompanying filing papers, are incorporated herein by reference. Aspects of the disclosure can be modified, if necessary, to employ the systems, functions, and concepts of the various references described above to provide yet further embodiments of the disclosure.

These and other changes can be made to the disclosure in light of the above Detailed Description. While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features, or aspects of the disclosure with which that terminology is associated. In general, the terms used in the following claims should not be construed to limit the disclosure to the specific embodiments disclosed in the specification, unless the above Detailed Description section explicitly defines such terms. Accordingly, the actual scope of the disclosure encompasses not only the disclosed embodiments, but also all equivalent ways of practicing or implementing the disclosure under the claims.

From the foregoing, it will be appreciated that specific embodiments have been described herein for purposes of illustration, but that various modifications may be made without deviating from the spirit and scope of the disclosed technology. Accordingly, the disclosed technology is not limited except as by the appended claims.

What is claimed is:

1. A method for constructing a model for a distribution network comprising:
   receiving, on a hardware device, Geographic Information System (GIS) data corresponding to a distribution network or a portion thereof from a GIS database;
   constructing an undirected graph utilizing the GIS data, wherein the undirected graph is represented by a data structure corresponding to a set of adjacency relationships between objects in the distribution network;
   performing, based on instructions stored on the hardware device, a traversal of the distribution network or the portion thereof using the set of adjacency relationships and attributes of the objects of the undirected graph in each step of the traversal to generate a directed graph represented by a data structure corresponding to a set of directed adjacency relationships between the objects, wherein the directed adjacency relationships include source and phase data;
   storing the data structure corresponding to a set of directed adjacency relationships between the objects in a local storage on the hardware device, wherein the data structure is stored in a form optimized for lookup speed in a cache memory on the hardware device;
   performing, in response to a command from a user of the hardware device, an analysis of the data structure corresponding to a set of directed adjacency relationships between the objects stored in the local storage on the hardware device while the hardware device is disconnected from the GIS database; and
   displaying a result of the analysis on the hardware device.

2. The method of claim 1, wherein the distribution network is an electric distribution network and the attributes include a source identifier attribute identifying a source vertex from which the traversal began, and a phases attribute indicating which of the electrical phases from the source vertex that pass through a first vertex reach an adjacent vertex.

3. The method of claim 1, wherein performing an analysis of the data structure comprises:
   accessing the data structure corresponding to a set of directed adjacency relationships between the objects for the distribution network or the portion thereof from the local storage to edit, perform a network analysis operation or visualize the distribution network or the portion thereof.

4. The method of claim 3, wherein the network analysis operation includes a tracing operation or an attribute query operation.

5. The method of claim 3, wherein the network analysis operation includes an electric tracing, a load flow analysis, or operating voltage calculations.

6. The method of claim 1, further comprising:
   renumbering objects in the data structure corresponding to a set of directed adjacency relationships between the objects to store the data structure corresponding to a set of directed adjacency relationships between the objects as an array on the hardware device, wherein an index of the array is a proxy for the corresponding object's original identifier in the GIS; and
   mapping GIS identifiers of the objects in the data structure corresponding to a set of directed adjacency relationships between the objects to index values of the array.

7. The method of claim 1, wherein the distribution network includes any one of: an electric distribution network, a gas distribution network, a water distribution network or a telecom distribution network.

8. The method of claim 1, further comprising:
   detecting a user request to perform a tracing analysis on a circuit in the distribution network, wherein the user request includes a selection of a point on the circuit;
   in response to the user request, accessing the data structure corresponding to a set of directed adjacency relationships between the objects for the distribution network from the cache memory to determine objects that are upstream and downstream of the point selected by the user;
   rendering a trace of an upstream path that starts from a source vertex and flows through the objects that are upstream to the point selected by the user; and
   rendering a trace of a downstream path that starts from the point selected by the user and flows through the objects that are downstream.

9. The method of claim 8, wherein rendering a trace of an upstream path includes using a first line pattern for the upstream path, and wherein rendering a trace of a downstream path includes using a second line pattern for the downstream path different from the first line pattern.

10. A non-transitory machine-readable medium comprising instructions which when executed by a machine cause the machine to execute a method comprising:
    receiving Geographic Information System (GIS) data for a utility distribution network from a GIS database, wherein the GIS data includes objects and spatial information associated with the objects;

constructing an undirected graph utilizing the GIS data, wherein the undirected graph is represented by a data structure corresponding to a set of adjacency relationships between the objects in the utility distribution network;

performing a traversal of the utility distribution network using the adjacency relationships and attributes of the objects of the undirected graph in each step of the traversal to generate a directed graph represented by a data structure corresponding to a set of directed adjacency relationships between the objects, wherein the directed adjacency relationships include source and phase data;

storing the data structure corresponding to a set of directed adjacency relationships between the objects in a cache memory on the machine to facilitate at least one of editing, analysis or visualization of a circuit in the utility distribution network while the machine is disconnected from the GIS database; and displaying a result of the editing, analysis, or visualization of the circuit in the utility distribution network on the machine.

11. The non-transitory machine-readable medium of claim 10, wherein performing a traversal of the utility distribution network further comprises:

starting from each source vertex, performing a traversal of the utility distribution network based on the set of adjacency relationships and attributes of the objects.

12. The non-transitory machine-readable medium of claim 10, wherein the set of adjacency relationships are represented by pairs of object identifiers and complements thereof.

13. The non-transitory machine-readable medium of claim 10, wherein the utility distribution network is one of: an electric distribution network, a gas distribution network, a water distribution network or a telecommunication distribution network.

14. The non-transitory machine-readable medium of claim 10, further comprising:

detecting a user request to perform a tracing analysis on a circuit in the utility distribution network, wherein the user request includes a selection of a point on the circuit;

in response to the user request, accessing the data structure corresponding to a set of directed adjacency relationships between the objects stored in the cache memory on the machine to determine objects that are upstream and downstream of the point selected by the user;

rendering a trace of an upstream path that starts from a source vertex and flows through the objects that are upstream to the point selected by the user; and rendering a trace of a downstream path that starts from the point selected by the user and flows through the objects that are downstream.

15. The non-transitory machine-readable medium of claim 14, wherein rendering a trace of an upstream path includes using a first line pattern for the upstream path, and wherein rendering a trace of a downstream path includes using a second line pattern for the downstream path different from the first line pattern.

16. A computer system for constructing a model for a distribution network comprising: a memory including a cache memory; and one or more processors configured to execute instructions stored in the memory to:

receive Geographic Information System (GIS) data for a distribution network from a GIS database, the GIS data including spatial information relating to objects in the distribution network;

construct an undirected graph utilizing the spatial information in the GIS data, wherein the undirected graph is represented by a data structure corresponding to a set of adjacency relationships between the objects;

construct a directed graph by traversing the undirected graph starting from each source vertex and tracking attributes of the objects in each step of the traversal, wherein the directed graph is represented by a data structure corresponding to a set of directed adjacency relationships between the objects, wherein the directed adjacency relationships include source and phase data;

cache the data structure corresponding to the directed graph in the cache memory on the computer system;

detect a user request to perform an analysis of the data structure corresponding to the directed graph;

access, in response to the user request, the data structure corresponding to the directed graph stored in the cache memory on the computer system while the computer system is disconnected from the GIS database;

perform the analysis of the data structure; and display a result of the analysis on the computer system.

17. The system of claim 16, wherein the distribution network includes any one of: an electric distribution network, a gas distribution network, a water distribution network or a telecom distribution network.

18. The system of claim 16, further configured to:

detect a user request to perform a tracing analysis on a circuit in the distribution network, wherein the user request includes a selection of a point on a circuit;

in response to the user request, access the data structure stored in the cache memory while the system is disconnected from the GIS database to determine objects that are upstream and downstream of the point selected by the user, wherein the data structure is stored in the form of an array or hashtable for improved lookup speed; and render a trace of an upstream path that starts from a source vertex and flows through the objects that are upstream to the point selected by the user; and render a trace of a downstream path that starts from the point selected by the user and flows through the objects that are downstream.

19. The computer system of claim 16, wherein render a trace of an upstream path includes use a first line pattern for the upstream path, and wherein render a trace of a downstream path includes use a second line pattern for the downstream path different from the first line pattern.

* * * * *